(12) United States Patent
Liu et al.

(10) Patent No.: US 11,592,928 B2
(45) Date of Patent: Feb. 28, 2023

(54) FLEXIBLE CIRCUIT BOARD, DRIVING STRUCTURE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Shaoning Liu, Beijing (CN); Zhicai Xu, Beijing (CN); Binfeng Feng, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/488,223

(22) Filed: Sep. 28, 2021

(65) Prior Publication Data

US 2022/0229530 A1    Jul. 21, 2022

(30) Foreign Application Priority Data

Jan. 19, 2021    (CN) .......................... 202120143444.6

(51) Int. Cl.
*G06F 3/041* (2006.01)
*H05K 1/02* (2006.01)
*G06F 3/044* (2006.01)

(52) U.S. Cl.
CPC ........ *G06F 3/04164* (2019.05); *G06F 3/0412* (2013.01); *H05K 1/028* (2013.01); *H05K 1/0218* (2013.01); *G06F 3/044* (2013.01); *G06F 3/041662* (2019.05); *G06F 2203/04107* (2013.01)

(58) Field of Classification Search
CPC .............. G06F 3/04164; G06F 3/0412; G06F 3/041662; G06F 3/044; G06F 2203/04107; H05K 1/0218; H05K 1/028
See application file for complete search history.

(56) References Cited

U.S. PATENT DOCUMENTS

| 2018/0145114 | A1* | 5/2018 | Sim | ................... | H01L 27/3276 |
| 2022/0028935 | A1* | 1/2022 | Park | .................. | H01L 27/3276 |
| 2022/0236819 | A1* | 7/2022 | Zhang | ............... | G06F 3/04164 |

* cited by examiner

*Primary Examiner* — Peter D McLoone
(74) *Attorney, Agent, or Firm* — Houtteman Law LLC (57) ABSTRACT

The present disclosure provides a flexible circuit board, a driving structure and a display device. The flexible circuit board includes: a base plate, including a bonding region and a first routing region between the bonding region and the first edge, touch lines and shielding lines on the base plate and insulated and spaced from each other, and the touch lines includes a first routing portion in the first routing region; wherein the flexible circuit board further includes: a first shielding layer electrically connected to the shielding lines and insulated and spaced from the touch lines, wherein the first shielding layer is in the first routing region and on a side of the first routing portion distal to the base plate, and an orthographic projection of the first shielding layer on the base plate covers an orthographic projection of the first routing portion on the base plate.

20 Claims, 7 Drawing Sheets

FLEXIBLE CIRCUIT BOARD, DRIVING STRUCTURE AND DISPLAY DEVICE

CROSS REFERENCE TO RELATED APPLICATIONS

The present application claims the priority of the Chinese Patent Application No. 202120143444.6 filed on Jan. 19, 2021, the content of which is incorporated herein by reference in its entirety.

TECHNICAL FIELD

The present disclosure relates to the field of display technology, and in particular to a flexible circuit board, a driving structure and a display device.

BACKGROUND

At present, a structural design commonly adopted by a touch display panel is to adopt a flexible multilayer on cell (FMLOC) technology. Specifically: a touch electrode layer is disposed on a package substrate of an OLED (Organic Light-Emitting Diode) display panel, thereby performing a touch control without an external touch substrate. The structure has the characteristics of low energy consumption, small screen thickness and the like.

SUMMARY

The present disclosure provides a flexible circuit board, a driving structure and a display device.

In a first aspect, the present disclosure provides a flexible circuit board, including: a base plate having a first edge extending along a first direction, and including a bonding region and a first routing region between the bonding region and the first edge, wherein the bonding region is a strip-shaped region, and the first direction is an extending direction of the bonding region; touch lines and shielding lines on the base plate and insulated and spaced from each other, and the touch lines include a first routing portion in the first routing region; wherein the flexible circuit board further includes: a first shielding layer electrically connected to the shielding lines and insulated and spaced from the touch lines, wherein the first shielding layer is in the first routing region and arranged on a side of the first routing portion distal to the base plate, and an orthographic projection of the first shielding layer on the base plate covers an orthographic projection of the first routing portion on the base plate.

In some embodiments of the present disclosure, the flexible circuit board further includes a first insulating layer on a side of the first shielding layer distal to the base plate.

In some embodiments of the present disclosure, a material of the first shielding layer is a metallic material.

In some embodiments of the present disclosure, the orthographic projection of the first shielding layer on the base plate is within an orthographic projection of the first insulating layer on the base plate.

In some embodiments of the present disclosure, the base plate further includes a second routing region between the bonding region and the first edge and arranged adjacent to the first routing region along the first direction; a ground line is on the base plate; a display signal transmission line is on the base plate and in the second routing region; a second shielding layer is on the base plate and on a side of the display signal transmission line distal to the base plate, the second shielding layer is connected to the ground line, and an orthographic projection of the second shielding layer on the base plate covers an orthographic projection of the display signal transmission line on the base plate.

In some embodiments of the present disclosure, the flexible circuit board further includes a second insulating layer on a side of the second shielding layer distal to the base plate.

In some embodiments of the present disclosure, the orthographic projection of the second shielding layer on the base plate is within an orthographic projection of the second insulating layer on the base plate.

In some embodiments of the present disclosure, the second shielding layer and the first shielding layer have a one-piece structure.

In some embodiments of the present disclosure, bonding electrodes and a touch detection chip are on the base plate, the bonding electrodes are in the bonding region, and the first routing portion is connected to the bonding electrodes; the touch detection chip is on a side of the bonding region distal to the first routing region, the touch lines further include: a second routing portion connected between the first routing portion and the touch detection chip.

In a second aspect, the present disclosure provides a driving structure including the flexible circuit board according to any one of the embodiments of the first aspect, the flexible circuit board including bonding electrodes in the bonding region.

In some embodiments of the present disclosure, the flexible circuit board further includes a first insulating layer on a side of the first shielding layer distal to the base plate.

In some embodiments of the present disclosure, a material of the first shielding layer is a metallic material.

In some embodiments of the present disclosure, the orthographic projection of the first shielding layer on the base plate is within an orthographic projection of the first insulating layer on the base plate.

In some embodiments of the present disclosure, the base plate further includes a second routing region between the bonding region and the first edge and arranged adjacent to the first routing region along the first direction; a ground line is on the base plate; a display signal transmission line is on the base plate and in the second routing region; a second shielding layer is on the base plate and on a side of the display signal transmission line distal to the base plate, the second shielding layer is connected to the ground line, and an orthographic projection of the second shielding layer on the base plate covers an orthographic projection of the display signal transmission line on the base plate.

In some embodiments of the present disclosure, the flexible circuit board further includes a second insulating layer on a side of the second shielding layer distal to the base plate.

In some embodiments of the present disclosure, the orthographic projection of the second shielding layer on the base plate is within an orthographic projection of the second insulating layer on the base plate.

In some embodiments of the present disclosure, the second shielding layer and the first shielding layer have a one-piece structure.

In some embodiments of the present disclosure, bonding electrodes and a touch detection chip are on the base plate, the bonding electrodes are in the bonding region, and the first routing portion is connected to the bonding electrodes; the touch detection chip is on a side of the bonding region distal to the first routing region, the touch lines further include: a second routing portion connected between the first routing portion and the touch detection chip.

In a third aspect, the present disclosure provides a display device, which includes a touch display panel and the driving structure according to any one of the embodiments of the second aspect; the driving structure is connected to the touch display panel; the driving structure further includes a chip on film connected between the flexible circuit board and the touch display panel and configured to provide a display driving signal for the touch display panel, and the bonding electrodes of the flexible circuit board are bonded to the chip on film.

In some embodiments of the present disclosure, the touch display panel includes: a display panel and a touch layer on the light outgoing side of the display panel; the touch layer includes: touch driving electrodes and touch sensing electrodes in a display region of the display panel; the touch driving electrodes and the touch sensing electrodes are electrically connected to the driving structure through corresponding touch leads; the touch layer further includes a ground lead and shielding leads; the ground lead is arranged in the peripheral region of the display panel; the touch leads to which the touch driving electrodes are connected and the touch leads to which the touch sensing electrodes are connected are separated from each other by one shielding lead, and the ground lead and the touch leads are separated from each other by the other shielding lead; the shielding leads are electrically connected to the shielding lines.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. In the drawings.

DETAIL DESCRIPTION OF EMBODIMENTS

The detailed description of the embodiments of the present disclosure will be described in detail with reference to the accompanying drawings. It should be understood that the detailed description of the embodiments described here are only used to illustrate and explain the present disclosure, not to limit the present disclosure.

In order to make the objects, technical solutions and advantages of the present disclosure more apparent, the technical solutions of the embodiments of the present disclosure will be described clearly and integrally below with reference to the accompanying drawings of the embodiments of the present disclosure. Obviously, the described embodiments are only part, not all, of the embodiments in the present invention. All other embodiments, which may be obtained by one of ordinary skill in the art without any creative effort based on the described embodiments in the present disclosure, belong to the protection scope of the present invention.

Terms used herein to describe embodiments of the present disclosure are not intended to limit and/or define the scope of the present disclosure. For example, unless defined otherwise, technical or scientific terms used herein should have the same meaning as commonly understood by one of ordinary skill in the art to which the present disclosure belongs. It should be understood that the terms of "first", "second", and the like used in the present disclosure are not intended to indicate any order, quantity, or importance, but rather are used for distinguishing one element from another. Unless the context clearly indicates otherwise, a singular form "a", "an", "the", or the like does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The term "connected", "coupled", or the like is not limited to physical or mechanical connections, but may include electrical connections, whether direct or indirect connections. The terms "upper", "lower", "left", "right", and the like are used merely for indicating relative positional relationships, and when the absolute position of an object being described is changed, the relative positional relationships may also be changed accordingly.

In the following description, when an element or layer is referred to as being "on" or "connected to" another element or layer, it may be directly on, connected to another element or layer, or intervening elements or layers may be present therebetween. However, when an element or layer is referred to as being "directly on" or "directly connected to" another element or layer, there are no intervening elements or layers present therebetween. The term "and/or" includes any and all combinations of one or more of the associated listed items.

The FMLOC technology has been gradually applied to the display field, particularly, in touch display devices. The flexible multilayer structure may be used to form a touch layer. A typical FMLOC film includes a first metal layer, an insulating layer, a second metal layer, and auxiliary layers such as a barrier layer and a protective layer. Unlike the traditional external touch panel product which is externally hung outside the display panel, the layers are directly formed on a packaging layer of a basic display panel through deposition, exposure, development, etching and other processes, so that the layers are integrated with the basic display panel, and thinning of the display device is facilitated. In addition, the touch display device using the FMLOC technology has the advantages of lower energy consumption, stronger function and the like.

When the FMLOC technology is applied, the problem of interference is inevitably encountered, which adversely affects the use effect, and even results in touch ghost points during the use. In order to solve the interference problem encountered when the FMLOC technology is applied, the present disclosure provides a flexible circuit board, a driving structure and a display device.

Figure 1:
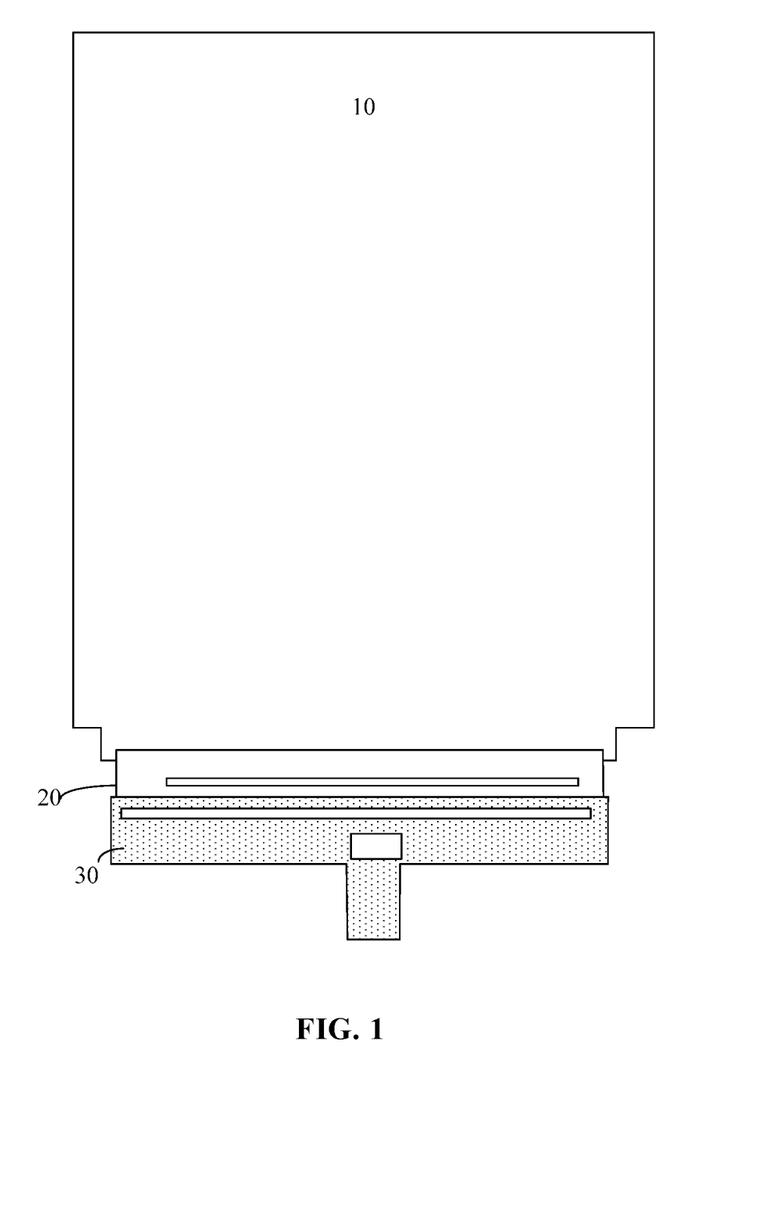
FIG. 1 is a schematic diagram of a touch display device provided in the related art.

FIG. 1 is a schematic diagram of a touch display device provided in the related art. As shown in FIG. 1, the touch display device includes a touch display panel 10 and a driving structure connected to the touch display panel. FIG.

Figure 2:
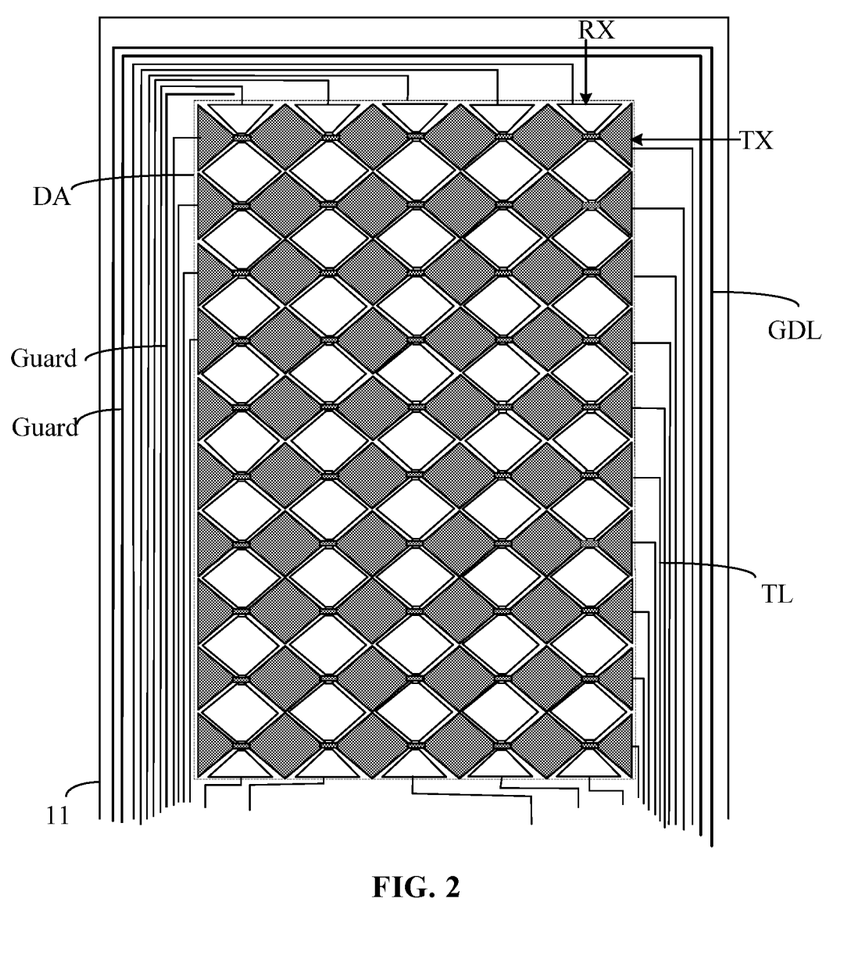
FIG. 2 is a plan view of a touch display panel provided in the related art.

2 is a plan view of a touch display panel provided in the related art. As shown in FIG. 2, the touch display panel includes a display panel and a touch layer disposed on a light outgoing side of the display panel; the display panel is, for example, an OLED panel, and includes a display region DA and a peripheral region located at the periphery of the display region DA; the touch layer includes a plurality of touch electrodes located in the display region DA, and each touch electrode is connected to at least one touch lead TL. For example, the plurality of touch electrodes include a plurality of touch driving electrodes TX and a plurality of touch sensing electrodes RX, and the touch driving electrode TX and the touch sensing electrode RX form a touch capacitor. Each touch lead TL is connected to a pad, and thus electrically connected to the driving structure through the pad.

In addition, as shown in FIG. 2, the touch layer further includes: a ground lead GDL located in the peripheral region, forming a semi-closed structure surrounding the display region DA; each touch lead TL is located on a side of the ground lead GDL proximal to the display region DA. The pads to which the ground lead GDL is connected are each configured to be loaded with a ground signal. Specifically, the pads, to which the ground lead GDL is connected, are connected to ground terminals on a touch detection chip, so as to prevent the touch electrodes and the touch leads TL from being interfered by external static electricity.

In addition, the touch layer further includes: shielding leads Guard; a shielding lead Guard is arranged between the touch leads TL to which the touch driving electrodes TX are connected and the touch leads TL to which the touch sensing electrodes RX are connected, and a shielding lead Guard is also arranged between the touch lead TL closest to the ground lead GDL and the ground lead GDL. The shielding leads are used to prevent the signal on the ground lead GDL from interfering with the signal on the touch leads TL, or prevent the touch leads TL to which the touch driving electrodes TX are connected from interfering with the signal on the touch leads TL to which the touch sensing electrodes RX are connected.

The driving structure includes: a flexible circuit board (FPC) 30 and a chip on film (COF) 20. The chip on film 20 is connected between the flexible circuit board 30 and the touch display panel 10, and includes a display driving chip for providing a display driving signal to the touch display panel 10. In addition, signal transmission may be performed between the flexible circuit board 30 and the touch display panel 10 through the chip on film 20.

Figure 3:
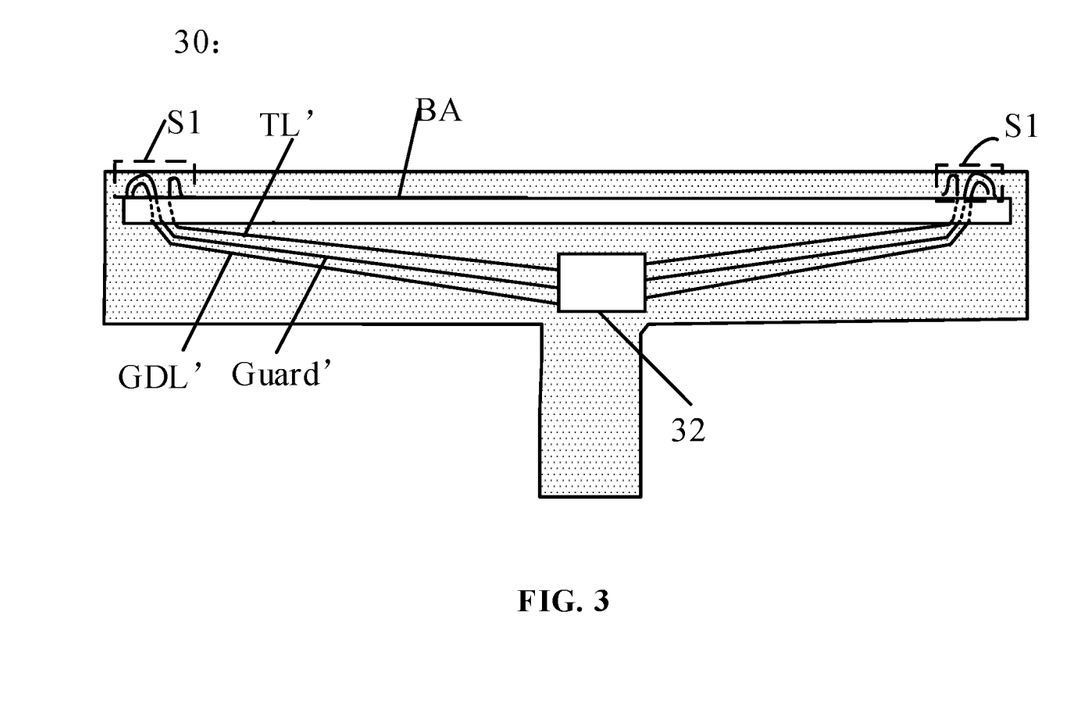
FIG. 3 is a schematic plan view of a flexible circuit board.
Figure 4:
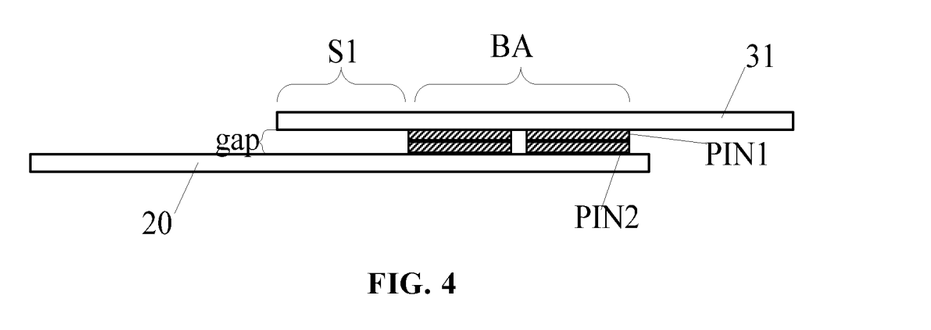
FIG. 4 is a schematic diagram of bonding between a flexible circuit board and a chip on film.

FIG. 3 is a schematic plan view of a flexible circuit board. FIG. 4 is a schematic diagram of bonding between a flexible circuit board and a chip on film. As shown in FIG. 3 to FIG. 4, the flexible circuit board 30 includes a base plate 31; a touch line TL', a ground line GDL', a shielding line Guard', a bonding electrode PIN1, and a touch detection chip 32 and the like disposed on the base plate 31. The base plate 31 is a flexible base plate, and may be made of a flexible material such as polyimide. The base plate 31 includes a bonding region BA where the bonding electrode PIN1 is located. The bonding electrode PIN1 of the flexible circuit board 30 is bonded to the bonding electrode PIN2 of the chip on film 20, thereby electrically connecting the flexible circuit board 30 to the chip on film 20. The touch line TL' is electrically connected to the touch detection chip 32, and each touch line TL' is electrically connected to one touch lead TL on the touch display panel 10 through the bonding electrode PIN1, so as to transmit the touch driving signal output by the touch detection chip 32 to the corresponding touch driving electrode TX, or transmit the sensing signal sensed by the touch sensing electrode RX to the touch detection chip 32. The ground line GDL' is electrically connected to the touch detection chip 32 and electrically connected to the ground lead GDL on the touch display panel through the chip on film 20, so as to transmit the ground signal provided by the touch detection chip 32 to the ground lead GDL on the touch display panel. The shielding line Guard' is electrically connected to the touch detection chip 32 and electrically connected to the shielding leads on the touch display panel through the chip on film 20, so as to transmit the shielding signal provided by the touch detection chip 32 to the shielding leads Guard, thereby preventing the touch line TL' (and the touch leads TL) from being interfered by signals on other lines.

Specifically, working stages of the touch display device include: a mutual-capacitance detection stage, a self-capacitance detection stage and a touch detection stage. A mutual-capacitance detection mode and a self-capacitance detection mode are initial working stages after the touch display device is started up. After the mutual-capacitance detection stage and the self-capacitance detection stage, the touch detection mode is entered. In the mutual-capacitance detection stage and the touch detection stage, the touch detection chip 32 provides a driving signal for the touch driving electrode TX and receives a sensing signal on the touch sensing electrode RX; in order to prevent signal interference between the touch lead TL (and touch line TL') connected to the touch driving electrode TX and the touch lead TL (and touch line TL') connected to the touch sensing electrode RX, the touch detection chip 32 further provides a ground signal to the shielding line Guard'. In the self-capacitance detection stage, the touch detection chip 32 provides a detection signal at a certain potential to the touch driving electrode TX and the touch sensing electrode RX; and in order to prevent the ground lead GDL (and the ground line GDL') from causing signal interference to the touch lead TL (and the touch line TL'), the touch detection chip 32 further provides a shielding signal to the shielding line Guard', and the shielding signal has the same potential as that of the detection signal.

As shown in FIGS. 1 to 4, in the flexible circuit board 30, in addition to the bonding region BA, the base plate 31 further includes a first routing region S1 on a side proximal to the touch display panel 10. In order to make the signal lines on the flexible circuit board 30 be reasonably arranged and stably transmit signals therethrough, a portion of the touch line TL' on the base plate 31 is usually located in the first routing region S1, and is referred to as a first routing portion. When the bonding electrodes PIN1 and the bonding electrodes PIN2 are bonded, a parasitic capacitance is generated between the first routing portion and the chip on film 20. For example, a parasitic capacitance is generated between the first routing portion and a signal line for grounding on the chip-on-film 20. The bonding electrodes PIN1 and PIN2 have a certain thickness, so that a certain gap is left between the first routing portion and the chip on film 20. In this way, when the driving structure is applied by an external force and thus a width of the gap changes, the parasitic capacitance between the first routing portion and the chip on film 20 changes, which affects the signal received by the touch detection chip 32 and further causes "ghost points" of the touch display panel 10.

In some embodiments, in order to prevent the parasitic capacitance between the first routing portion and the chip on film 20 from changing, adhesive may be applied to the edge of the flexible circuit board 30 to maintain the overlapping portion of the flexible circuit board 30 and the chip on film 20 relatively fixed, so as to avoid the following case: the parasitic capacitance between the first routing portion and the chip on film 20 changes, which affects the signal received by the touch detection chip 32 and further causes "ghost points" of the touch display panel 10. However, a thickness of the driving structure is easily increased by gluing. In addition, after gluing, a value of the parasitic capacitance changes uncontrollably compared with that before gluing.

Figure 5:
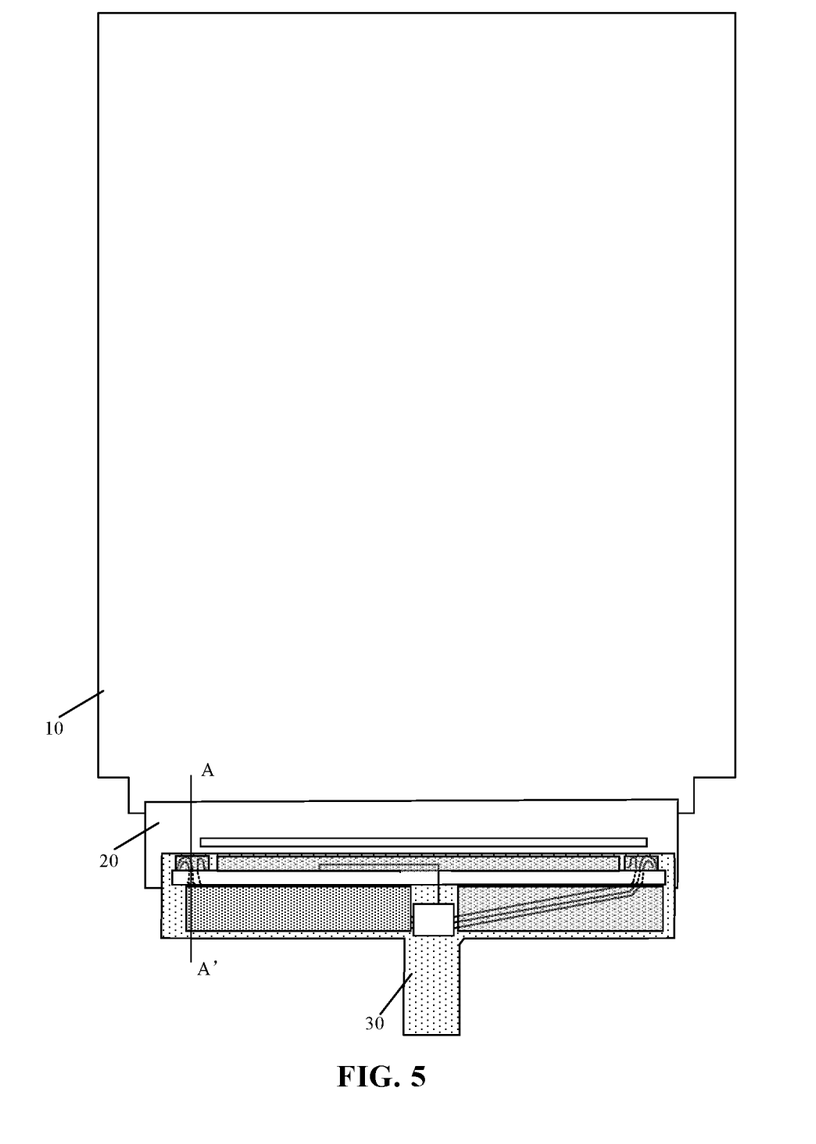
FIG. 5 is a schematic diagram of a display device according to some embodiments of the present disclosure.
Figure 6:
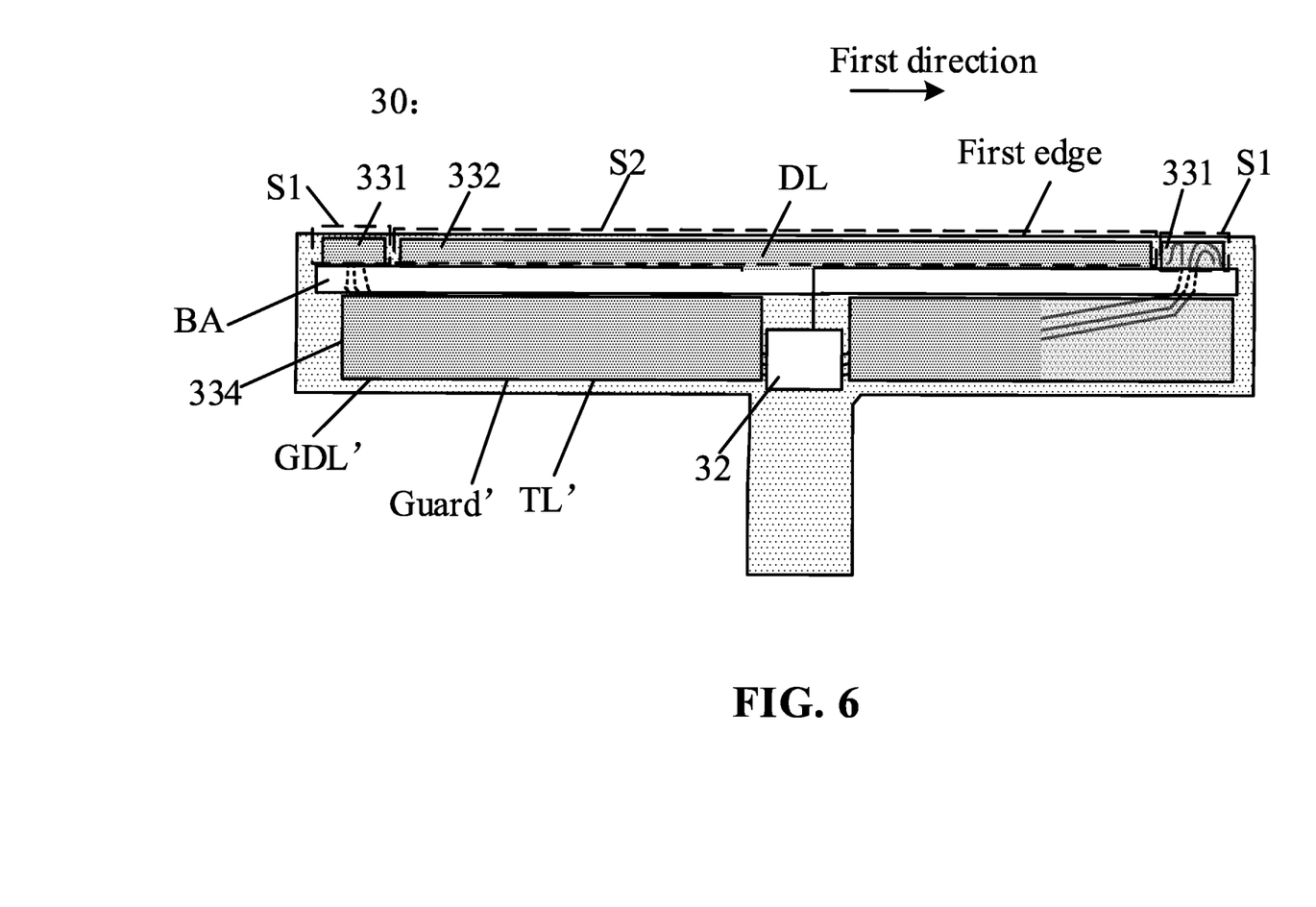
FIG. 6 is a plan view of a flexible circuit board according to some embodiments of the present disclosure.
Figure 7:
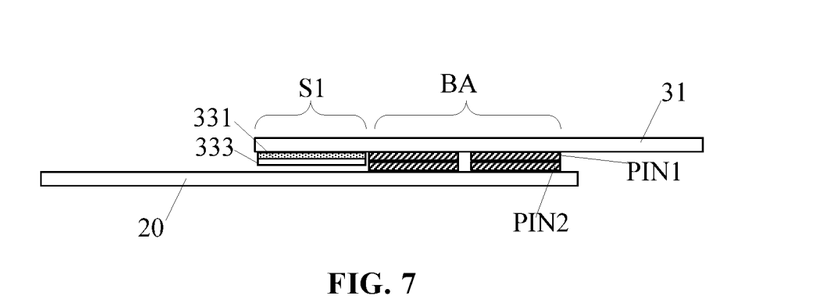
FIG. 7 is a schematic diagram of bonding between a flexible circuit board and a chip on film according to some embodiments of the present disclosure.

FIG. 5 is a schematic diagram of a display device according to some embodiments of the present disclosure. FIG. 6 is a plan view of a flexible circuit board according to some embodiments of the present disclosure. FIG. 7 is a schematic diagram of the bonding between a flexible circuit board and a chip on film according to some embodiments of the present disclosure. FIG. 7 is a cross-sectional view taken along a line AA' of FIG. 5. The display panel 10 included in the display device of FIG. 5 is not shown in FIG. 7, for convenience of description.

As shown in FIGS. 6 and 7, the flexible circuit board includes a base plate 31, a shielding line Guard', a touch line TL', and a first shielding layer.

The base plate 31 may be a flexible base plate 31. The base plate 31 has a first edge extending in a first direction. The base plate 31 includes: a bonding region BA and a first routing region S1 located between the bonding region BA and the first edge; the bonding region BA is a strip-shaped region; the first direction is an extending direction of the bonding region BA; the extending direction is a length direction of the bonding region BA. The bonding region BA is provided with a plurality of bonding electrodes PIN1. The base plate 31 has a plurality of edges, wherein the first edge is an edge having a maximum length, as shown in FIG. 6, an uppermost edge of the base plate 31.

In addition, in the present disclosure, the first edge (or the bonding region BA) extending in the first direction means that the extending direction of the first edge (or the bonding region BA) is substantially parallel to the first direction. For example, an angle between the extending direction of the first edge (or the bonding region BA) and the first direction may be in a range of 0 to 10°.

The touch line TL' and the shielding line Guard' are disposed on the base plate 31 and spaced and insulating from each other, and the touch line TL' includes a first routing portion located in the first routing region S1. As described above, the shielding line Guard' is used to prevent the ground line GDL' from causing signal interference to the touch line TL', and to prevent the touch line TL' connected to the touch driving electrodes from causing signal interference to the touch line TL' connected to the touch sensing electrodes.

In the present disclosure, a first shielding layer 331 is disposed on a side of the first routing portion distal to the base plate 31. The first shielding layer 331 is electrically connected to the shielding line Guard' and is spaced and insulating from the touch line TL'. An orthographic projection of the first routing portion on the base plate 31 is located within an orthographic projection of the first shielding layer 331 on the base plate 31. Therefore, when the bonding electrodes PIN1 in the bonding region BA are bonded to the chip on film 20, the first shielding layer 331 may perform an electromagnetic shielding effect on the first routing portion by providing the shielding signal to the shielding line Guard', thereby reducing interference on the signal on the first routing portion and reducing "ghost points" of the touch display panel.

A material of the first shielding layer 331 may include a metal material with good conductivity, such as silver.

Figure 8:
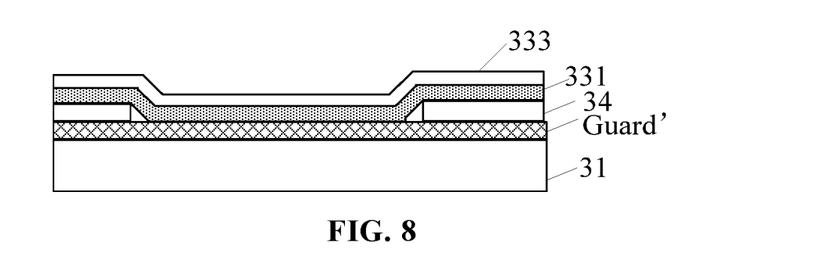
FIG. 8 is a schematic diagram of a connection between a first shielding layer and a shielding line according to some embodiments of the present disclosure.

FIG. 8 is a schematic diagram of a connection between a first shielding layer and a shielding line according to some embodiments of the present disclosure. FIG. 8 schematically shows the relationship between the first shielding layer and the shielding line and an arrangement of the respective layers. As shown in FIG. 8, a protective layer 34 may be provided on a side of the touch line TL' and the shielding line Guard' distal to the base plate 31, to protect lines in the flexible circuit board. When the first shielding layer 331 is electrically connected to the shielding line Guard', an opening may be formed in the protective layer 34 to expose the shielding line Guard', and the first shielding layer 331 is connected to the shielding line Guard' through the opening.

As shown in FIGS. 7 and 8, a first insulating layer 333 is provided on a side of the first shielding layer 331 distal to the base plate 31. After the flexible circuit board 30 is bonded to the chip on film 20, the first insulating layer 333 may prevent short circuit between the first shielding layer 331 and lines on the chip on film 20 from occurring. In addition, the first shielding layer 331 and the first insulating layer 333 are provided such that the gap between the chip on film 20 and the first routing region S1 of the flexible circuit board is reduced (even to zero), so as to keep the parasitic capacitance between the first routing portion and the chip on film 20 stable, thereby preventing the influence on the signal received by the touch detection chip 32, and further avoiding the occurrence of "ghost points" on the touch display panel 10.

An orthographic projection of the first shielding layer 331 on the base plate 31 is located within an orthographic projection of the first insulating layer 333 on the base plate 31, so that the protection effect of the first insulating layer 333 on the first shielding layer 331 is further improved, and it is ensured that the first shielding layer 331 is not short-circuited with lines on the chip on film 20.

As shown in FIG. 6, the base plate 31 further includes a second routing region S2 between the bonding region BA and the first edge and arranged adjacent to the first routing region S1 along the first direction. Optionally, the number of the first routing regions S1 is two, two first routing regions S1 are arranged along the first direction, and the second routing region S2 is located between the two first routing regions S1. As shown in FIG. 6, a ground line GDL' and a display signal transmission line DL are further disposed on the base plate 31, the display signal transmission line DL is located in the second routing region S2, and a position of the ground line GDL' is not defined. The display signal transmission line DL is used for transmitting a signal used in display. For example, in the driving structure of the touch display device, the display signal transmission line DL in the second routing region S2 is used to connect the touch detection chip 32 to the display driving chip of the chip on film 20, and there is no signal flow between the display signal transmission line DL and the touch driving electrodes and the touch sensing electrodes on the display panel.

It should be noted that only a few signal lines are schematically shown in FIG. 6, and shapes of respective signal lines are schematically described.

As shown in FIG. 6, a second shielding layer 332 is further disposed on a side of the display signal transmission line DL distal to the base plate 31, is electrically connected to the ground line GDL', and an orthogonal projection of the second shielding layer 332 on the base plate 31 at least covers an orthogonal projection of the display signal transmission line DL on the base plate 31. The second shielding layer 332 is disposed, so as to prevent the signal on the display signal transmission line DL from being interfered when a distance between the display signal transmission line DL and the chip on film 20 is changed.

A second insulating layer is disposed on a side of the second shielding layer 332 distal to the base plate 31 to prevent the second shielding layer 332 from being shorted with the signal lines on the chip on film 20. An orthographic projection of the second shielding layer 332 on the base plate 31 is located within an orthographic projection of the second insulating layer on the base plate 31. The second shielding layer 332 and the first shielding layer 331 may be formed as a single piece to have a one-piece structure.

As shown in FIGS. 6 and 7, the bonding electrodes PIN1 and the touch detection chip 32 are further provided on the base plate 31; the bonding electrodes PIN1 are arranged in the bonding region BA, and connected to the first routing portion; the touch detection chip 32 is located on a side of the bonding region BA distal to the first routing region S1. The touch line TL' further includes: a second routing portion connected between the first routing portion and the touch detection chip 32. For example, the second routing portion is located in the bonding region BA, and the first routing portion and the second routing portion may be located in different layers; an insulating layer is arranged between a layer where the first routing portion is located and a layer where the second routing portion is located; the first routing portion is connected to the second routing portion through a via in the insulating layer.

The touch line TL' may further include a third routing portion, where the third routing portion is a portion of the touch line TL' between the bonding region BA and the touch detection chip 32, and the second routing portion is connected to the touch detection chip 32 through the third routing portion.

Optionally, a third shielding layer 334 is disposed on a side of the bonding region BA distal to the second routing region S2, the third shielding layer 334 is connected to the ground line GDL', and an orthogonal projection of the third shielding layer 334 on the base plate 31 covers an orthogonal projection of the third routing portion on the base plate 31, so as to reduce signal interference on the third routing portion.

The embodiment of the present disclosure further provides a driving structure, as shown in FIG. 7, the driving structure includes a chip on film 20 and the flexible circuit board 30 provided in the foregoing embodiment, and bonding electrodes PIN1 of the flexible circuit board 30 are bonded to bonding electrodes PIN2 of the chip on film 20.

The embodiment of the present disclosure also provides a display device. As shown in FIG. 5, the display device includes a touch display panel 10 and the above driving structure, and the driving structure is connected to the touch display panel 10. The chip on film 20 is connected between the flexible circuit board 30 and the touch display panel 10, and is configured to provide a display driving signal for the touch display panel 10, and the bonding electrodes PIN1 of the flexible circuit board 30 are bonded to the bonding electrodes PIN2 of the chip on film 20.

The structure of the touch display panel in FIG. 5 is the same as that in FIG. 2, and the touch display panel 10 includes: a display panel 11 and a touch layer arranged on the light outgoing side of the display panel 11; the touch layer includes: touch driving electrodes TX and touch sensing electrodes RX located in a display region of the display panel 11; the touch driving electrodes TX and the touch sensing electrodes RX are electrically connected to the driving structure through the corresponding touch leads TL.

The touch layer also includes a ground lead GDL and shielding leads Guard; the ground lead GDL is located in the peripheral region of the display panel 11; the touch leads TL to which the touch driving electrodes TX are connected and the touch leads TL to which the touch sensing electrodes RX are connected are separated from each other by one shielding lead Guard, and the ground lead GDL and the touch leads TL are separated from each other by the other shielding lead Guard; the shielding leads Guard are electrically connected to the shielding lines Guard' on the flexible circuit board.

The specific description of the touch display panel may be referred to the above description, and is not repeated here.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A flexible circuit board, comprising:
a base plate having a first edge extending along a first direction, and comprising a bonding region and a first routing region between the bonding region and the first edge, wherein the bonding region is a strip-shaped region, and the first direction is an extending direction of the bonding region;
touch lines and shielding lines on the base plate, and insulated and spaced from each other, wherein the touch lines comprise a first routing portion in the first routing region;
wherein the flexible circuit board further comprises:
a first shielding layer electrically connected to the shielding lines, and insulated and spaced from the touch lines, wherein the first shielding layer is in the first routing region and arranged on a side of the first routing portion distal to the base plate, and an orthographic projection of the first shielding layer on the base plate covers an orthographic projection of the first routing portion on the base plate.

2. The flexible circuit board of claim 1, further comprising a first insulating layer on a side of the first shielding layer distal to the base plate.

3. The flexible circuit board of claim 2, wherein the orthographic projection of the first shielding layer on the base plate is within an orthographic projection of the first insulating layer on the base plate.

4. The flexible circuit board of claim 3, wherein the base plate further comprises a second routing region between the bonding region and the first edge and arranged adjacent to the first routing region along the first direction;
a ground line is on the base plate;
a display signal transmission line is on the base plate and in the second routing region;
a second shielding layer is on the base plate and on a side of the display signal transmission line distal to the base plate, the second shielding layer is connected to the ground line, and an orthographic projection of the second shielding layer on the base plate covers an orthographic projection of the display signal transmission line on the base plate.

5. The flexible circuit board of claim 4, further comprising a second insulating layer on a side of the second shielding layer distal to the base plate.

6. The flexible circuit board of claim 5, wherein the orthographic projection of the second shielding layer on the base plate is within an orthographic projection of the second insulating layer on the base plate.

7. The flexible circuit board of claim 6, wherein the second shielding layer and the first shielding layer have a one-piece structure.

8. The flexible circuit board of claim 1, wherein a material of the first shielding layer is a metallic material.

9. The flexible circuit board of claim 1, wherein bonding electrodes and a touch detection chip are on the base plate, the bonding electrodes are in the bonding region, and the first routing portion is connected to the bonding electrodes; the touch detection chip is on a side of the bonding region distal to the first routing region, and the touch lines further comprise: a second routing portion connected between the first routing portion and the touch detection chip.

10. A driving structure, comprising the flexible circuit board of claim 1, wherein the flexible circuit board comprises bonding electrodes in the bonding region.

11. The driving structure of claim 10, further comprising a first insulating layer on a side of the first shielding layer distal to the base plate.

12. The driving structure of claim 11, wherein the orthographic projection of the first shielding layer on the base plate is within an orthographic projection of the first insulating layer on the base plate.

13. The driving structure of claim 12, wherein the base plate further comprises a second routing region between the bonding region and the first edge and arranged adjacent to the first routing region along the first direction;

a ground line is on the base plate;

a display signal transmission line is on the base plate and in the second routing region;

a second shielding layer is on the base plate and on a side of the display signal transmission line distal to the base plate, the second shielding layer is connected to the ground line, and an orthographic projection of the second shielding layer on the base plate covers an orthographic projection of the display signal transmission line on the base plate.

14. The driving structure of claim 13, further comprising a second insulating layer on a side of the second shielding layer distal to the base plate.

15. The driving structure of claim 14, wherein the orthographic projection of the second shielding layer on the base plate is within an orthographic projection of the second insulating layer on the base plate.

16. The driving structure of claim 15, wherein the second shielding layer and the first shielding layer have a one-piece structure.

17. The driving structure of claim 10, wherein a material of the first shielding layer is a metallic material.

18. The driving structure of claim 10, wherein bonding electrodes and a touch detection chip are on the base plate, the bonding electrodes are in the bonding region, and the first routing portion is connected to the bonding electrodes; the touch detection chip is on a side of the bonding region distal to the first routing region, and the touch lines further comprise: a second routing portion connected between the first routing portion and the touch detection chip.

19. A display device comprising a touch display panel and the driving structure of claim 10; the driving structure is connected to the touch display panel;

the driving structure further comprises a chip on film connected between the flexible circuit board and the touch display panel and configured to provide a display driving signal for the touch display panel, and the bonding electrodes of the flexible circuit board are bonded to the chip on film.

20. The display device of claim 19, wherein the touch display panel comprises: a display panel and a touch layer on the light outgoing side of the display panel; the touch layer comprises: touch driving electrodes and touch sensing electrodes in a display region of the display panel; the touch driving electrodes and the touch sensing electrodes are electrically connected to the driving structure through corresponding touch leads; and the touch layer further comprises a ground lead and shielding leads; the ground lead is arranged in the peripheral region of the display panel; the touch leads to which the touch driving electrodes are connected and the touch leads to which the touch sensing electrodes are connected are separated from each other by one shielding lead, and the ground lead and the touch leads are separated from each other by the other shielding lead; the shielding leads are electrically connected to the shielding lines.

* * * * *